United States Patent
Huang et al.

(10) Patent No.: US 9,711,542 B2
(45) Date of Patent: Jul. 18, 2017

(54) METHOD FOR FABRICATING DISPLAY PANEL

(71) Applicant: AU Optronics Corp., Hsin-Chu (TW)

(72) Inventors: Yu-Han Huang, Hsin-Chu (TW); Kuo-Yu Huang, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 355 days.

(21) Appl. No.: 14/552,432

(22) Filed: Nov. 24, 2014

(65) Prior Publication Data
US 2015/0362811 A1    Dec. 17, 2015

(30) Foreign Application Priority Data
Jun. 17, 2014   (TW) ............................. 103120914 A

(51) Int. Cl.
*H01L 27/12* (2006.01)
*G02F 1/1343* (2006.01)
*G02F 1/1362* (2006.01)

(52) U.S. Cl.
CPC .... *H01L 27/1262* (2013.01); *G02F 1/134363* (2013.01); *G02F 1/136227* (2013.01); *H01L 27/124* (2013.01); *H01L 27/1225* (2013.01); *H01L 27/1288* (2013.01)

(58) Field of Classification Search
CPC ............... H01L 27/1288; H01L 27/124; H01L 27/1248; H01L 29/458; H01L 27/1214; G02F 1/136227; G02F 1/136286
See application file for complete search history.

(56) References Cited

U.S. PATENT DOCUMENTS

| | | | |
|---|---|---|---|
| 7,915,074 B2 | 3/2011 | Yoon | |
| 8,450,129 B2 | 5/2013 | Chin | |
| 2002/0074549 A1* | 6/2002 | Park | G02F 1/13458 257/59 |
| 2003/0085404 A1* | 5/2003 | Kim | G02F 1/13458 257/72 |
| 2005/0024550 A1* | 2/2005 | Kim | G02F 1/136227 349/43 |

(Continued)

FOREIGN PATENT DOCUMENTS

| | | |
|---|---|---|
| CN | 102842587 A | 12/2012 |
| CN | 103151304 A | 6/2013 |

OTHER PUBLICATIONS

State Intellectual Property Office of the P. R. C, "Office Action", Jul. 4, 2016, China.

*Primary Examiner* — Bradley K Smith
*Assistant Examiner* — David Goodwin
(74) *Attorney, Agent, or Firm* — Locke Lord LLP; Tim Tingkang Xia, Esq.

(57) ABSTRACT

A method for fabricating a display panel includes forming a first patterned conductive layer, a gate insulation layer, a semiconductor channel layer, a first passivation layer, a second patterned conductive layer and a pixel electrode on a first substrate. The first patterned conductive layer includes a gate electrode, and the second patterned conductive layer includes a source electrode, a drain electrode and a data line. The patterns of the gate insulation layer, the first passivation layer and the second patterned conductive layer are defined by an etching process and a lift-off process with the same photomask.

9 Claims, 18 Drawing Sheets

(56) References Cited

U.S. PATENT DOCUMENTS

| | | | |
|---|---|---|---|
| 2005/0110011 A1* | 5/2005 | Im | H01L 27/1248 257/40 |
| 2005/0156239 A1* | 7/2005 | Seko | H01L 21/31116 257/347 |
| 2006/0094154 A1* | 5/2006 | Lung | H01L 45/06 438/102 |
| 2013/0154472 A1 | 6/2013 | Lin | |

* cited by examiner

METHOD FOR FABRICATING DISPLAY PANEL

BACKGROUND OF THE INVENTION

1. Field of the Invention

The present invention relates to a method for fabricating a display panel, and more particularly to a process-simplified method for fabricating a display panel.

2. Description of the Prior Art

Because of advantages such as compact, lightweight, and power saving, liquid crystal display panels are widely applied in various kinds of electronic products such as smart phones, notebook computers and tablet PCs. The liquid crystal display device becomes the main stream product in the field of flat televisions while the technology of large size liquid crystal display panels develops rapidly.

In the liquid crystal display panel, a display matrix is mainly applied to provide display functions. The display matrix is composed of a plurality of sub-pixels arranged in an array configuration. Each of the sub-pixels includes a thin film transistor unit, a storage capacitor unit, and a liquid crystal capacitor unit. According to the definition of different semiconductor materials, the thin film transistor units are generally classified in three major groups, which are amorphous silicon thin film transistor (a-Si TFT) unit, poly silicon thin film transistor unit, and oxide semiconductor thin film transistor unit. The amorphous silicon thin film transistor unit cannot be good enough to satisfy requirements of foreseeable high performance display devices, because the electrical mobility of the amorphous silicon thin film transistor, which is mainly determined by material properties of amorphous silicon, cannot be effectively enhanced. The electrical mobility of the poly silicon thin film transistor unit is much better because of material properties of poly silicon. However, because of process issues such as worse uniformity, which is mainly generated by crystallization processes applied to large size substrates, the poly silicon thin film transistors are mainly applied in small size display devices. The oxide semiconductor material in the oxide semiconductor thin film transistor unit is generally amorphous, and the electrical mobility of the oxide semiconductor thin film transistor unit, which is generally 10 times higher than the electrical mobility of the amorphous silicon thin film transistor unit, may satisfy the requirements of the foreseeable high performance display devices. There are liquid crystal display panels employing oxide semiconductor thin film transistor units in the market accordingly.

SUMMARY OF THE INVENTION

It is one of the objectives of the present invention to provide a method for fabricating a display panel so as to simplify the complexity of the manufacturing processes of the display panel.

A method for fabricating a display panel is provided in an embodiment of the present invention. The method includes following steps. A first substrate is provided. A first patterned conductive layer is formed on the first substrate. The first patterned conductive layer includes a gate electrode. A gate insulation layer is formed on the first substrate and the first patterned conductive layer. A semiconductor channel layer is formed on the gate insulation layer. The semiconductor channel layer at least partially overlaps the gate electrode in a vertical projective direction. A first passivation layer is formed on the gate insulation layer and the semiconductor channel layer. A patterned photoresist layer is formed on the first passivation layer. The patterned photoresist layer includes a first photoresist pattern, a second photoresist pattern, and a plurality of openings. A thickness of the first photoresist pattern is higher than a thickness of the second photoresist pattern. The first passivation layer exposed by the openings is removed to expose a first contact section and a second contact section of the semiconductor channel layer. An ashing process is performed for removing the second photoresist pattern and partially exposing an upper surface of the first passivation layer. A conductive layer is formed on the patterned photoresist layer. The conductive layer contacts the first contact section and the second contact section, and the conductive layer contacts the upper surface of the first passivation layer exposed by the patterned photoresist layer. A lift-off process is performed for removing the patterned photoresist layer and the conductive layer on the patterned photoresist layer and forming a second patterned conductive layer. The second patterned conductive layer comprises a source electrode contacting the first contact section, a drain electrode contacting the second contact section, and a data line disposed on the upper surface of the first passivation layer and connected to the source electrode. A second passivation layer is formed on the second patterned conductive layer. A pixel electrode is formed on the second passivation layer, and the pixel electrode is electrically connected to the drain electrode.

In the method for fabricating the display panel, the lift-off process is used to define patterns of the gate insulation layer, the first passivation layer, and the second patterned conductive layer simultaneously so as to eliminate at least two sets of photomask. The manufacturing processes may be simplified and the manufacturing cost may be greatly reduced. In addition, the advantage such as self-alignment and short channel may be realized because the first passivation layer and the second patterned conductive layer including the source electrode and the drain electrode are defined by the same photomask, the aperture ratio may be enhanced accordingly, and the unit characteristics of the thin film transistor units may be unified.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, embodiments are detailed as follows. The embodiments of the present invention are illustrated in the accompanying drawings with numbered elements to clarify the contents and effects to be achieved.

Figure 1:
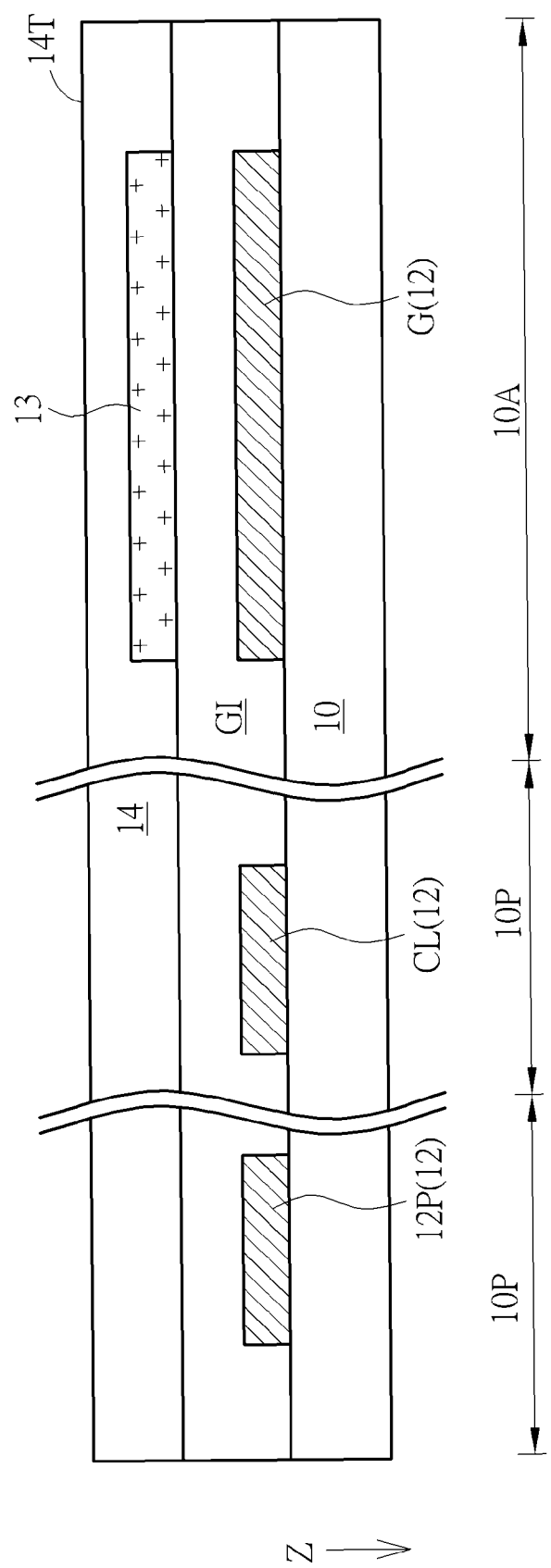
FIGS. 1-13 are schematic diagrams illustrating a method for fabricating a display panel according to a first embodiment of the present invention.
Figure 11:
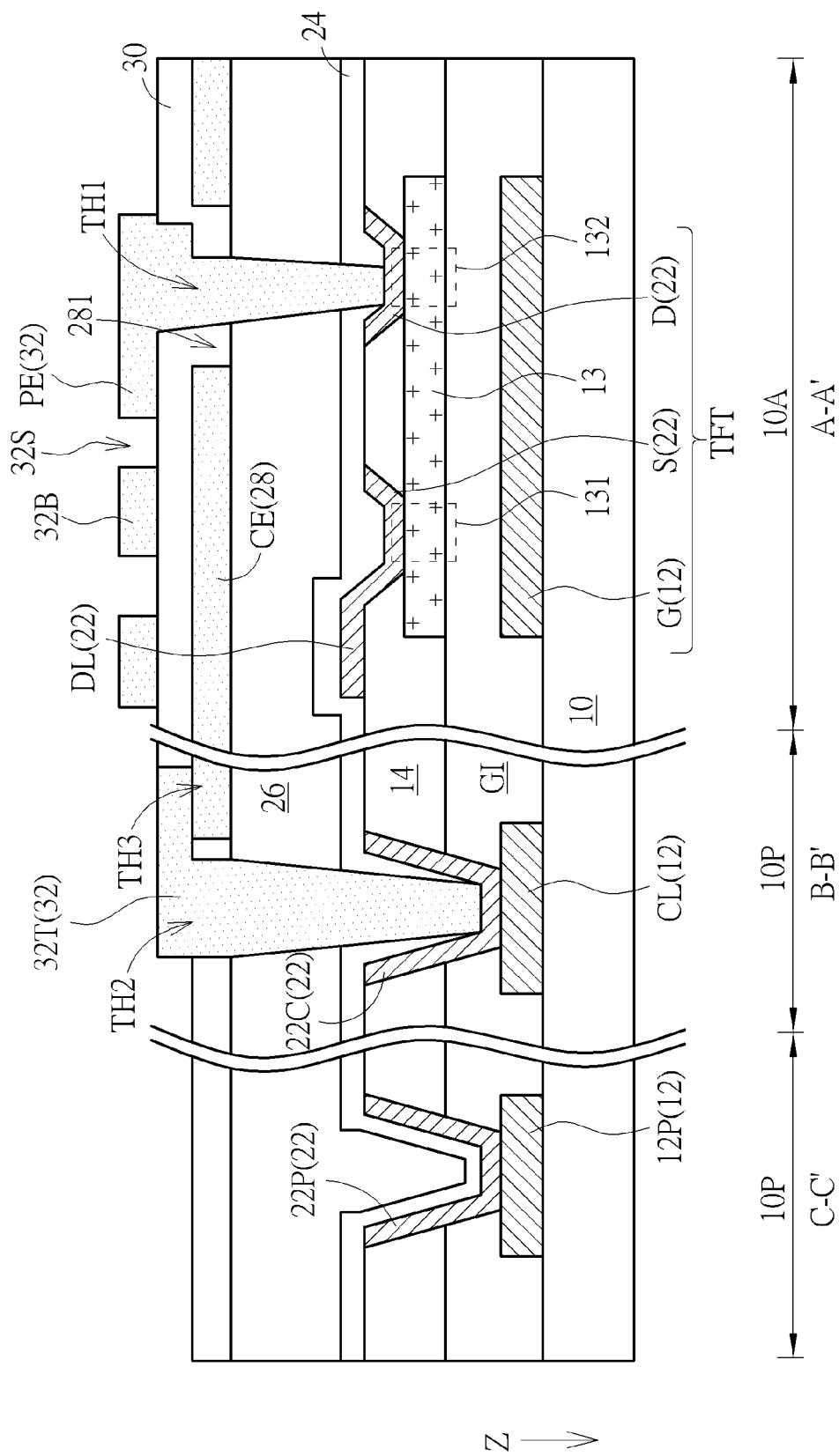
Figure 12:
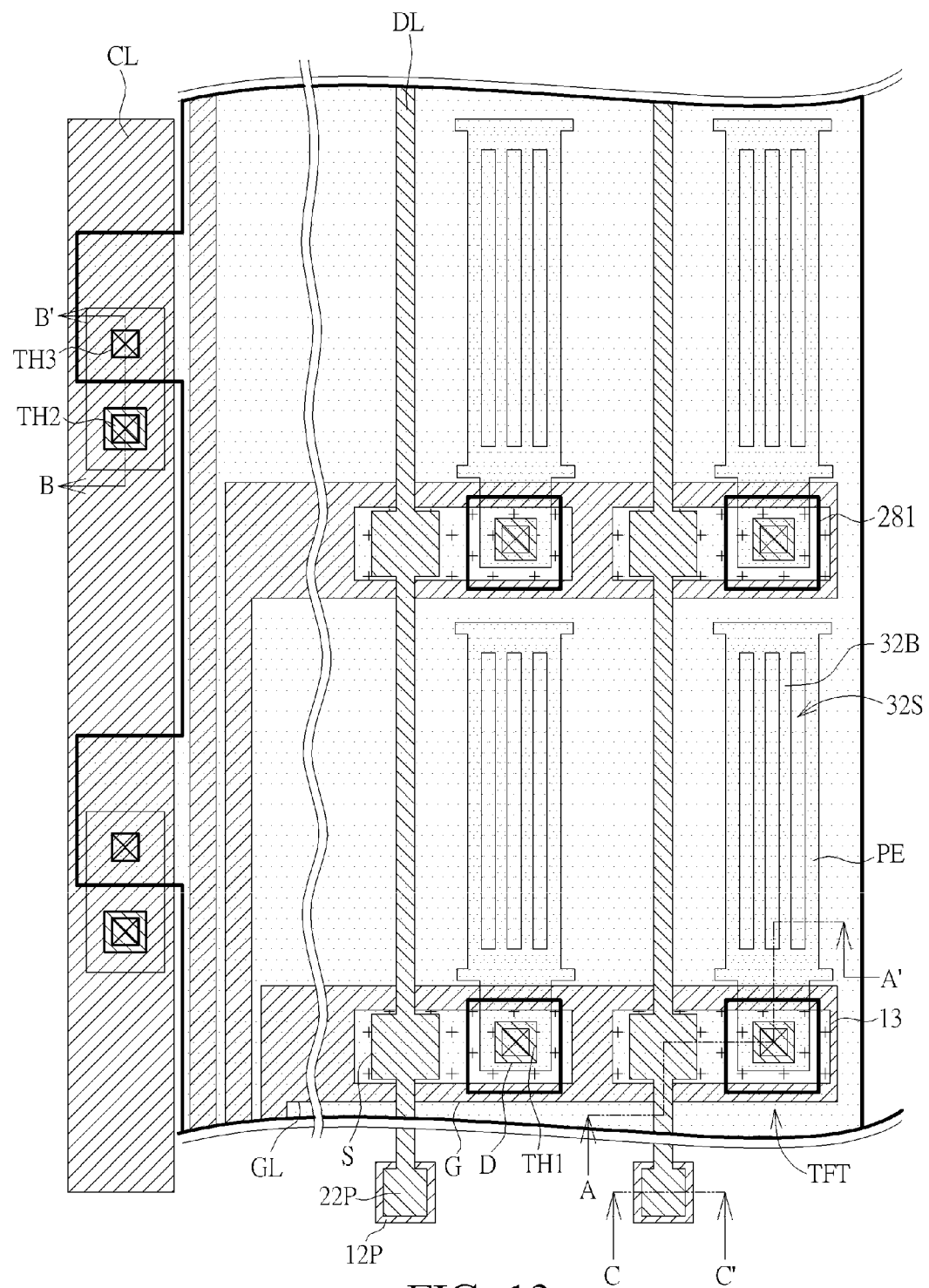

Please refer to FIGS. 1-13. FIGS. 1-13 are schematic diagrams illustrating a method for fabricating a display panel according to a first embodiment of the present invention. FIG. 1-11 and FIG. 13 are cross-sectional diagrams of the display panel, FIG. 12 is a top-view diagram, and FIG. 11 is a cross-sectional diagram taken along a cross-sectional line A-A', a cross-sectional line B-B', and a cross-sectional line C-C' in FIG. 12. As shown in FIG. 1, a first substrate 10 is provided first. The first substrate 10 is used as a base substrate of an array substrate (or thin film transistor substrate). The first substrate 10 may be a rigid substrate or a flexible substrate, such as a glass substrate, a plastic substrate, or a quartz substrate, but not limited thereto. The first substrate may have an active region 10A and a peripheral region 10P disposed on at least one side of the active region 10A. A first patterned conductive layer 12 is then formed on the first substrate 10. The first patterned conductive layer 12 may include a gate electrode G. The first patterned conductive layer 12 may further selectively include a gate line (not shown), a common line CL, and at least one lower connection pad 12P. The gate electrode G and the gate line are disposed in the active region 10A. The gate line is electrically connected to the gate electrode G so as to apply a gate voltage to the gate electrode G. The common line CL is disposed in the peripheral region 10P and configured to apply a common voltage. The lower connection pad 12P is disposed in the peripheral region 10P and may be electrically connected to the gate line, a data line or the common line CL. The lower connection pad 12P may be used as a connection pad for electrically connecting between a driver chip (not shown) and conductive lines such as the gate line, the data line, or the common line CL. The pattern of the first patterned conductive layer 12 may be formed and defined by an exposure process using one photomask, a developing process, and an etching process. A material of the first patterned conductive layer 12 may include opaque conductive materials such as a metal material or an alloy, and/or transparent materials such as indium tin oxide (ITO) or indium zinc oxide (IZO), but not limited thereto. A gate insulation layer GI is then formed on the first substrate 10 and the first patterned conductive layer 12. A material of the gate insulation layer GI may include organic insulation materials or inorganic insulation materials such as silicon oxide, silicon nitride, or silicon oxynitride. A semiconductor channel layer 13 is then formed on the gate insulation layer GI. The semiconductor channel layer 13 at least partially overlaps the gate electrode G in a vertical projective direction Z. For example, the semiconductor channel layer 13 and the gate electrode G may substantially overlap with each other completely to be corresponding to each other, or the semiconductor channel layer 13 may only partially overlap the gate electrode G and the semiconductor channel layer 13 may be slightly smaller than or slightly larger than the gate electrode G. In this embodiment, the semiconductor channel layer 13 may include an oxide semiconductor channel layer. The material of the semiconductor channel layer 13 may include indium gallium zinc oxide (IGZO), indium gallium oxide (IGO), indium zinc oxide (IZO), indium tin oxide (ITO), titanium oxide (TiO), zinc oxide (ZnO), indium oxide (InO), gallium oxide (GaO), or other suitable semiconductor materials. A first passivation layer 14 is then formed on the gate insulation layer GI and the semiconductor channel layer 13. A material of the first passivation layer 14 may include organic insulation materials or inorganic insulation materials such as silicon oxide, silicon nitride, or silicon oxynitride.

Figure 2:
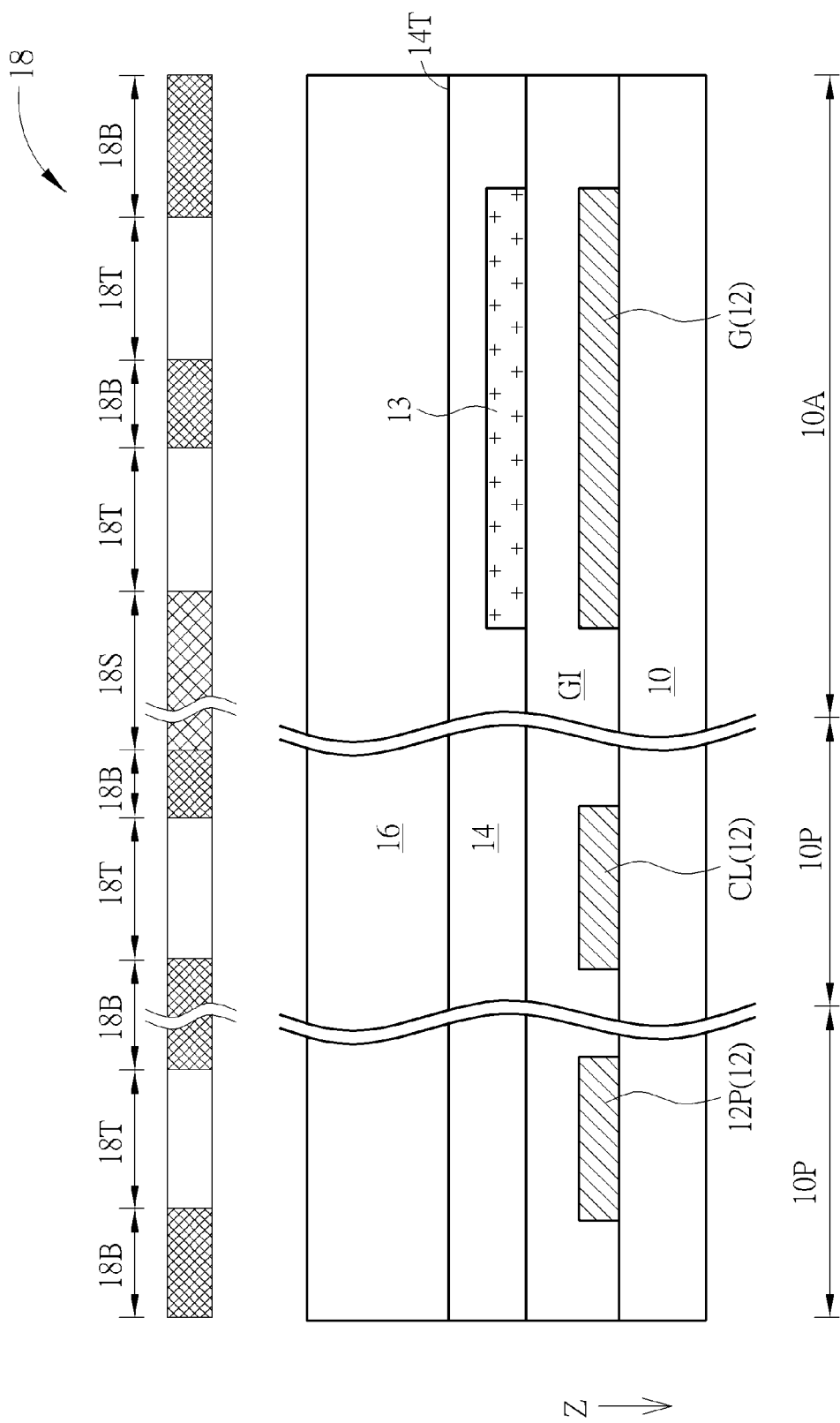

A patterned photoresist layer is then formed on the first passivation layer 14. In this embodiment, the step of forming the patterned photoresist layer on the first passivation layer 14 are detailed in FIG. 2, FIG. 3, and related paragraphs. As shown in FIG. 2, a photoresist layer 16 is formed on the first passivation layer 14. A gray tone photomask 18 is then disposed above the photoresist layer 16. The gray tone photomask 18 has a light transmitting region 18T, a half-tone region 18S, and a light shielding region 18B. A light transmittance of the light transmitting region 18T is higher than a light transmittance of the half-tone region 18S, and the light transmittance of the half-tone region 18S is higher than a light transmittance of the light shielding region 18B. For example, the light transmittance of the light transmitting region 18T may be around 100%, the light transmittance of the half-tone region 18S may be around 50%, and the light transmittance of the light shielding region 18B may be around 0%, but not limited thereto.

Figure 3:
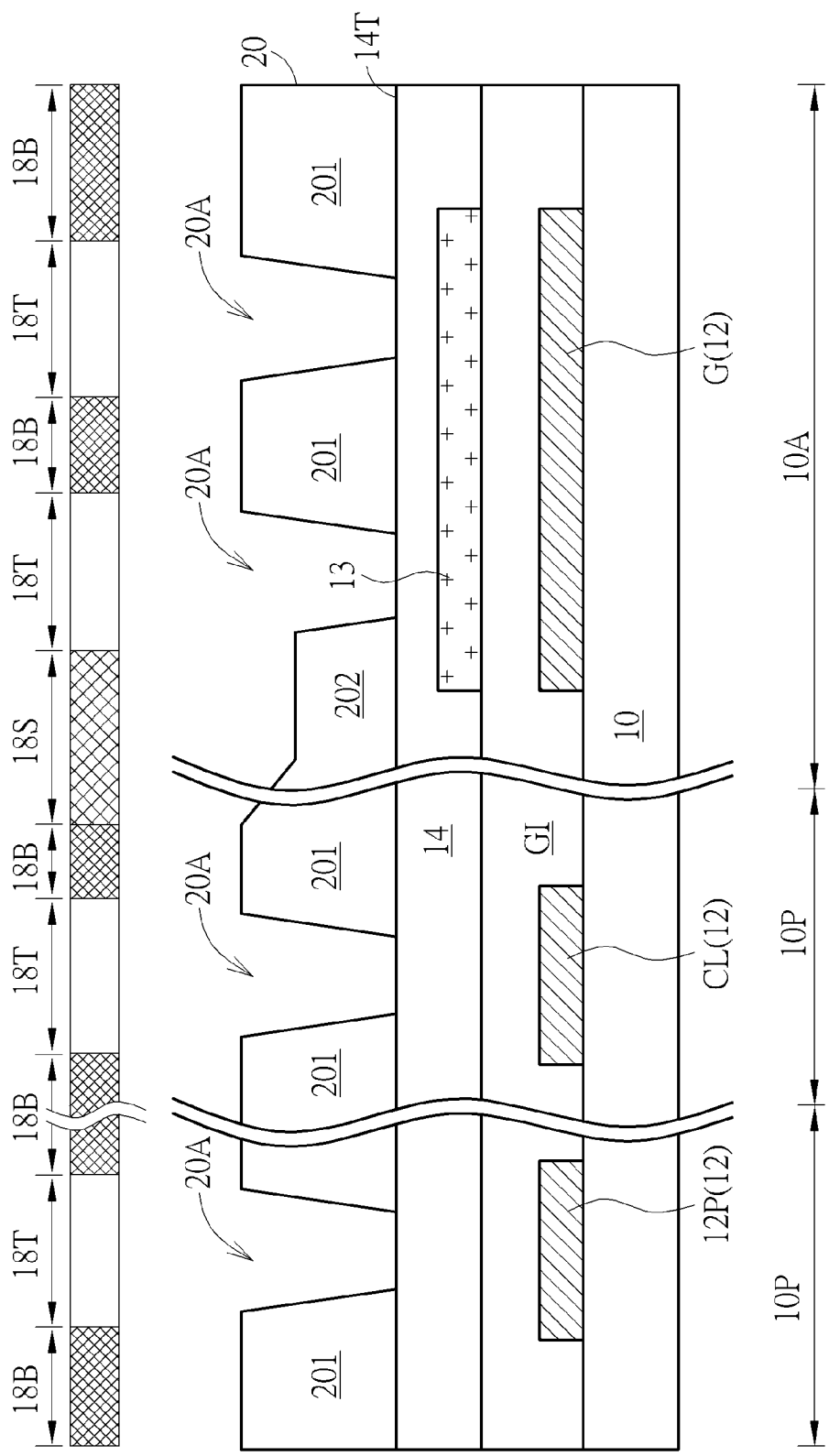

As shown in FIG. 3, a patterned photoresist layer 20 is then formed by performing an exposure process using the gray tone photomask 18 as a shielding mask and a developing process. The patterned photoresist layer 20 includes a first photoresist pattern 201, a second photoresist pattern 202, and a plurality of openings 20A. A thickness of the first photoresist pattern 201 is higher than a thickness of the second photoresist pattern 202. In this embodiment, the patterned photoresist layer 20 includes at least two openings 20A corresponding to one part of the semiconductor channel layer 13 respectively. Additionally, if the first patterned conductive layer 12 includes the common line CL and the lower connection pad 12P, the patterned photoresist layer 20 may further include more opening 20A corresponding to the common line CL and the lower connection pad 12P. In this embodiment, a material of the photoresist layer 16 may be a positive type photoresist, the irradiated region will be removed after the developing process, and the unirradiated region will remain after the developing process. Therefore, the light transmitting region 18T is located corresponding to the openings 20A, the light shielding region 18B is located corresponding to the first photoresist pattern 201, and the half-tone region 18S is located corresponding to the second photoresist pattern 202. In one alternative embodiment, the material of the photoresist layer 16 may be a negative type photoresist, the unirradiated region will be removed after the developing process, and the irradiated region will remain after the developing process. In this situation, the light transmitting region 18T will be located corresponding to the first photoresist pattern 201, the light shielding region 18B will be located corresponding to the openings 20A, and the half-tone region 18S is located corresponding to the second photoresist pattern 202.

Figure 4:
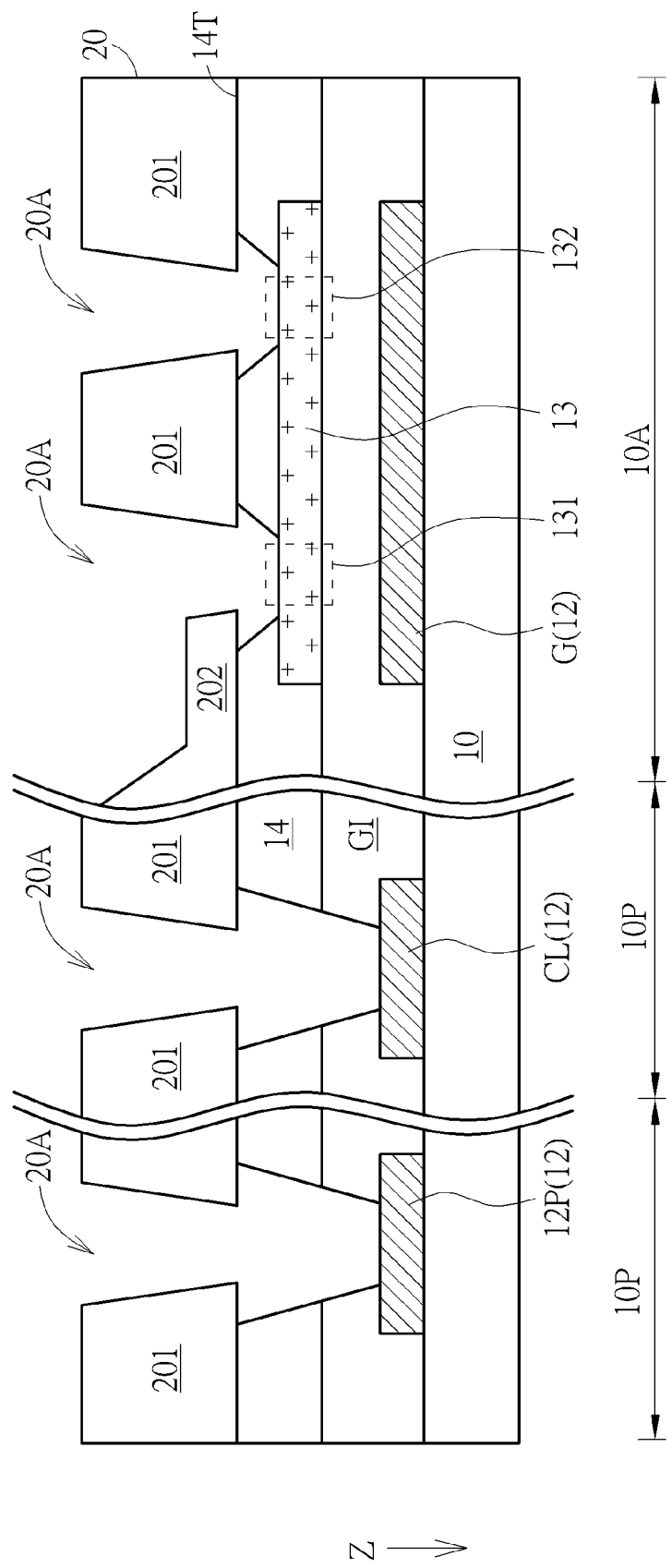

As shown in FIG. 4, the first passivation layer 14 exposed by a part of the openings 20A is removed to partially expose a first contact section 131 and a second contact section 132 of the semiconductor channel layer 13. A portion of the bottom surface of the first photoresist pattern 201 and a portion of the slant surface of the first passivation layer 14 together form an undercut. A portion of the first photoresist pattern 201 protrudes an edge of the first passivation layer 14. The first passivation layer 14 and the gate insulation layer GI exposed by another part of the openings 20A in the patterned photoresist layer 20 are removed for partially exposing the common line CL and the lower connection pad 12P. The above mentioned steps may also be realized by etching processes.

Figure 5:
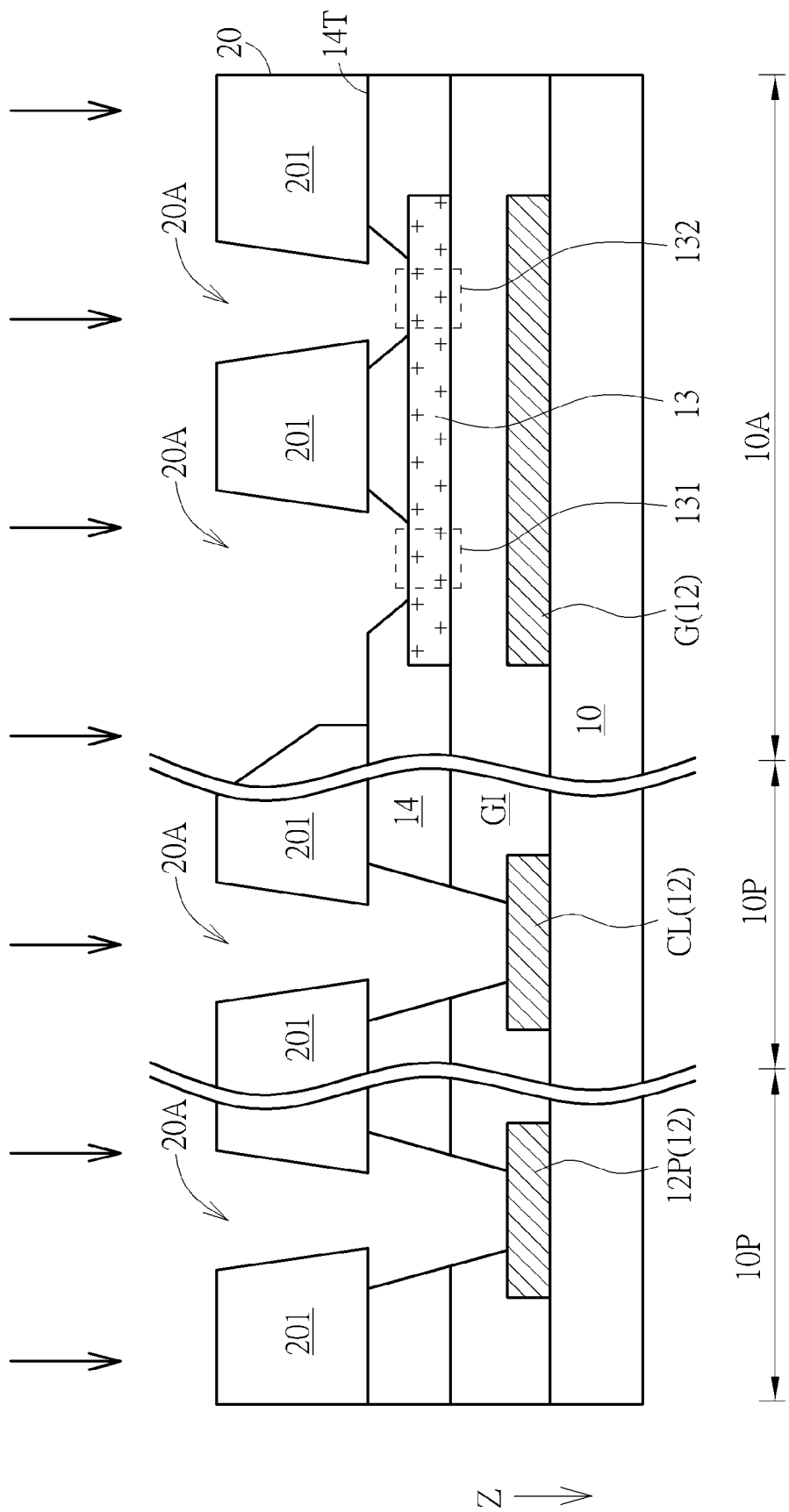

As shown in FIG. 5, an ashing process (as arrows in FIG. 5) is then performed for removing the second photoresist pattern 202 and partially exposing an upper surface 14T of the first passivation layer 14. The thickness of the first photoresist pattern 201 may be slightly reduced after the ashing process, but the first photoresist pattern 201 still covers a part of the upper surface 14T of the first passivation layer 14 after the ashing process.

Figure 6:
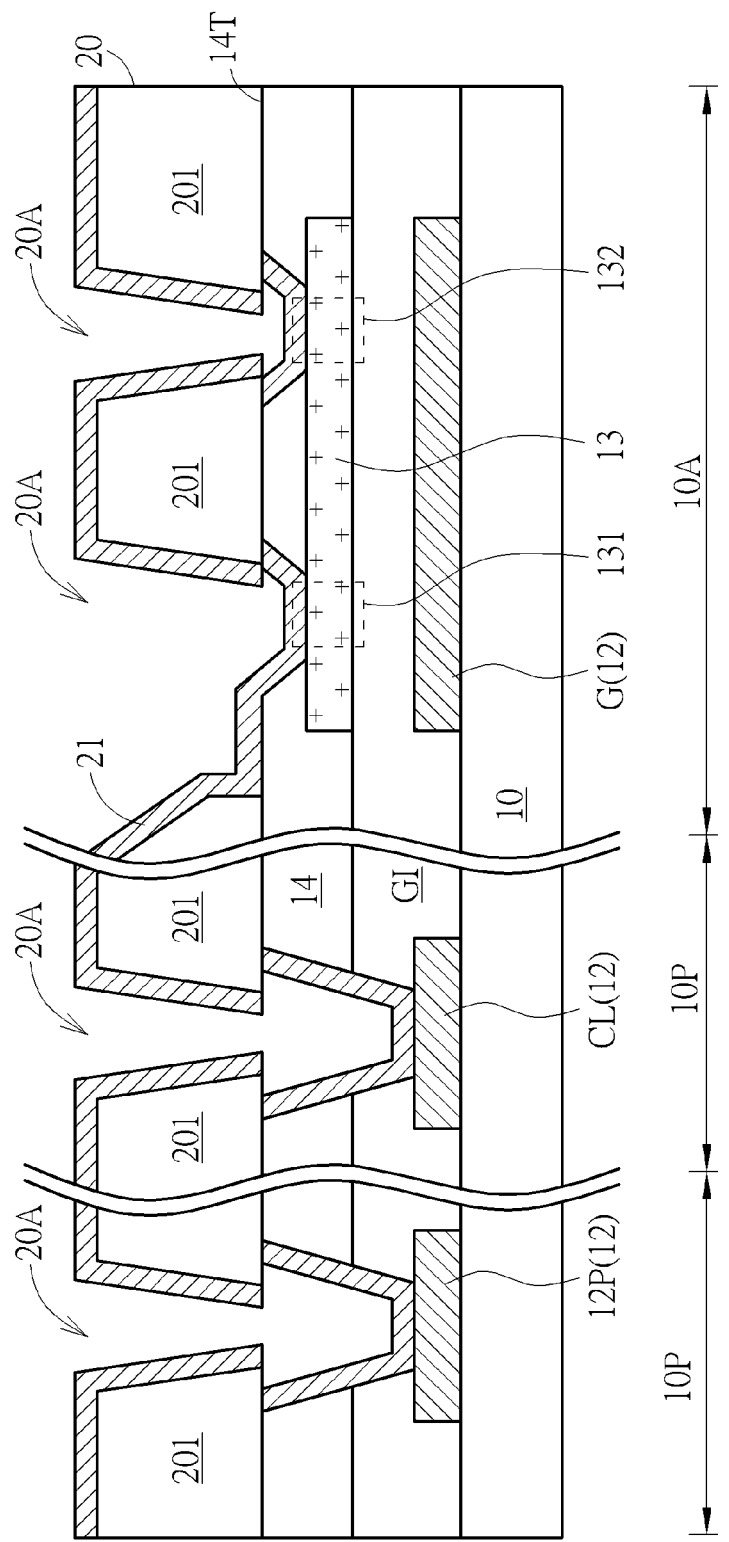

As shown in FIG. 6, a conductive layer 21 is then entirely formed on the patterned photoresist layer 20. The conductive layer 21 contacts the first contact section 131 and the second contact section 132, and the conductive layer 21 is electrically connected to the first contact section 131 and the second contact section 132. The conductive layer 21 contacts the upper surface 14T of the first passivation layer 14 exposed by the patterned photoresist layer 20. In addition, the conductive layer 21 may further contact and be electrically connected to the common line CL and the lower connection pad 12P.

Figure 7:
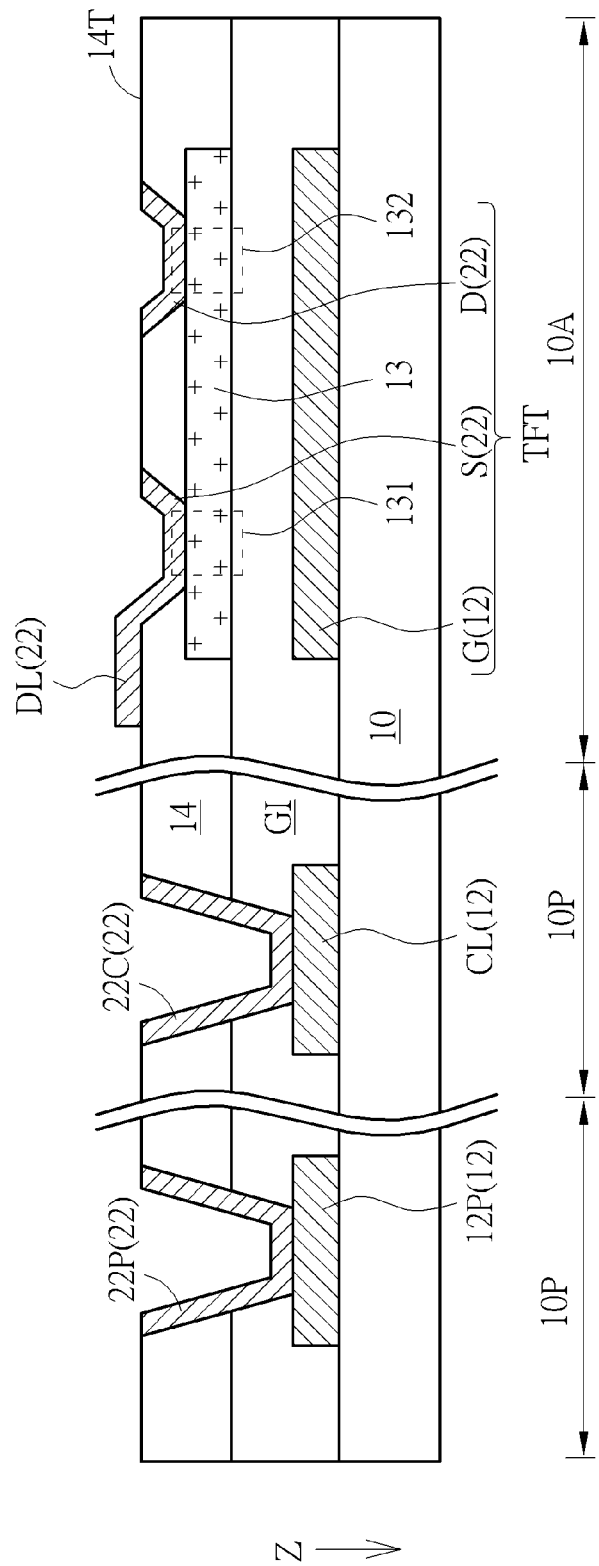

As shown in FIG. 7, a lift-off process is then performed for removing the patterned photoresist layer 20 and removing a portion of the conductive layer 21 on the patterned photoresist layer 20 together, and a part of the conductive layer 21 will remain on the first connection section 131, the second connection section 132, a part of the upper surface 14T of the first passivation layer 14, the common line CL, and the lower connection pad 12P exposed by the patterned photoresist layer 20 so as to form a second patterned conductive layer 22. The second patterned conductive layer 22 includes a source electrode S contacting and electrically connected to the first contact section 131, a drain electrode D contacting and electrically connected to the second contact section 132, and a data line DL disposed on the upper surface 14T of the first passivation layer 14 and electrically connected to the source electrode S. The drain electrode D is completely located within a concave of the first passivation layer 14 so that the drain electrode D does not contact a flat portion of the upper surface 14T. The gate electrode G, the gate insulation layer GI, the semiconductor channel layer 13, the source electrode S, and the drain electrode D are configured to form a thin film transistor TFT. Additionally, the second patterned conductive layer 22 may further include a connection electrode 22C and an upper connection pad 22P. The connection electrode 22C contacts the common line CL exposed by the patterned photoresist layer 20 and is electrically connected to the common line CL. The upper connection pad 22P contacts the lower connection pad 12P exposed by the patterned photoresist layer 20 and is electrically connected to the lower connection pad 12P.

Figure 8:
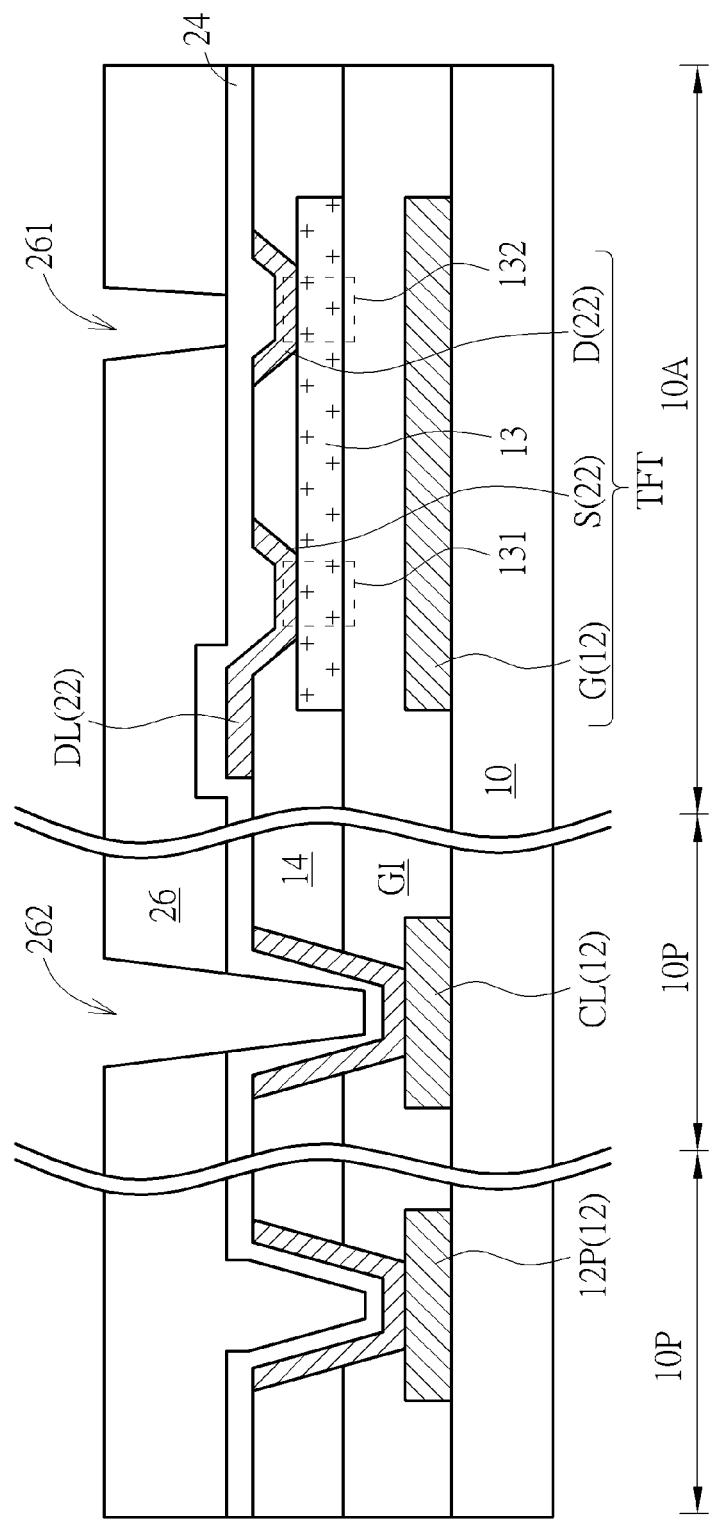

As shown in FIG. 8, a second passivation layer 24 is then formed on the second patterned conductive layer 22. A material of the second passivation layer 24 may include inorganic insulation materials such as silicon oxide, silicon nitride, or silicon oxynitride, but not limited thereto. A third passivation layer 26 is then formed on the second passivation layer 24. Materials of the second passivation layer 24 and the third passivation layer 26 may be different. The third passivation layer 26 includes a first hole 261 partially exposing the second passivation layer 24 corresponding to the drain electrode D and a second hole 262 partially exposing the second passivation layer 24 corresponding to the common line CL. A material of the third passivation layer 26 may include an organic insulation layer, and the third passivation layer 26 may be a photo sensitive (or photopatternable) organic insulation material preferably so as to form the first hole 261 and the second hole 262 by an exposure process and a developing process, but not limited thereto. Additionally, the third passivation layer 26 may be a planarization layer with a plane surface for forming successive layers more easily.

Figure 9:
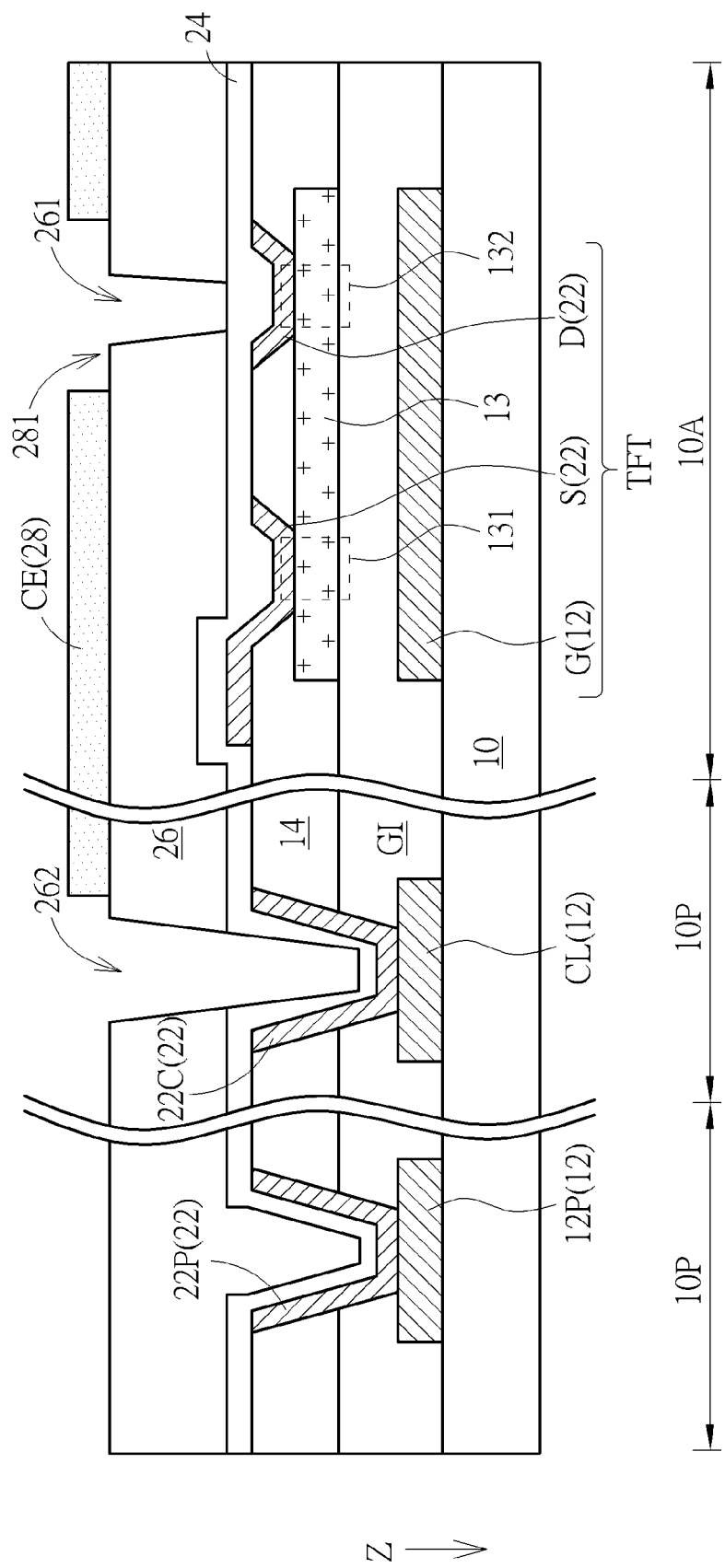

As shown in FIG. 9, a third patterned conductive layer 28 is formed on the third passivation layer 26. The third patterned conductive layer 28 includes a common electrode CE. The pattern of the third patterned conductive layer 28 may be formed and defined by an exposure process using one photomask, a developing process, and an etching process. A material of the third patterned conductive layer 28 may include transparent conductive materials such as indium tin oxide (ITO) or indium zinc oxide (IZO), but not limited thereto. In this embodiment, the common electrode CE has a hole 281. The hole 281 of the common electrode CE may be located corresponding to the first hole 261 of the third passivation layer 26. The hole 281 of the common electrode CE and the first hole 261 of the third passivation layer 26 are both configured to expose a part of the second passivation layer 24 corresponding to the drain electrode D, and the hole 281 of the common electrode CE is slightly larger than the first hole 261 of the third passivation layer 26 preferably.

Figure 10:
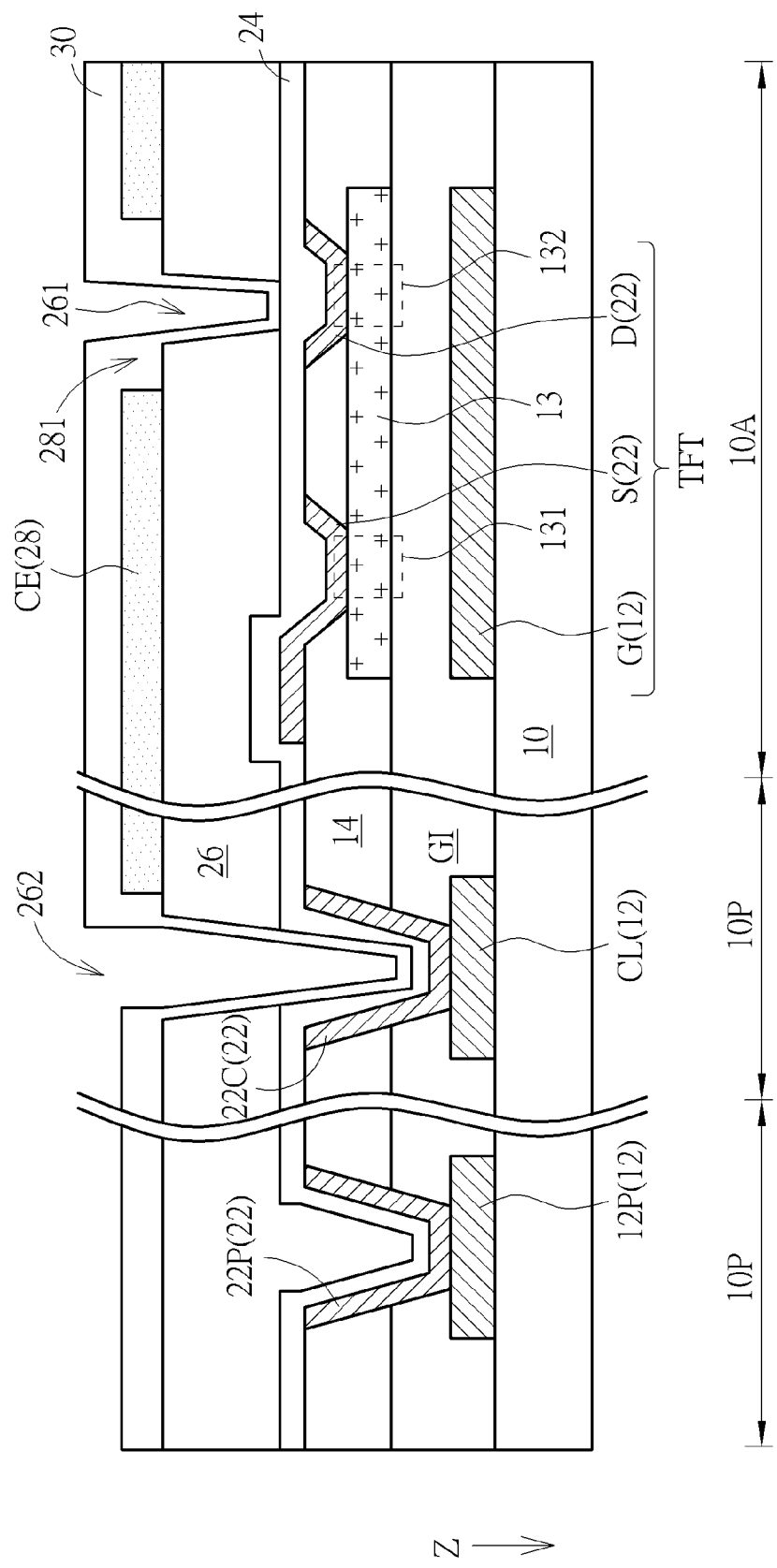

As shown in FIG. 10, a fourth passivation layer 30 is then entirely formed on the third passivation layer 26, the third patterned conductive layer 28, the common electrode CE, and the second passivation layer 24 exposed by the first hole 261 and the second hole 262. A material of the fourth passivation layer 30 may include inorganic insulation materials such as silicon oxide, silicon nitride, or silicon oxynitride, but not limited thereto.

As shown in FIG. 11 and FIG. 12, the fourth passivation layer 30 and the second passivation layer 24 in the first hole 261 are removed for forming a first contact hole TH1 partially exposing the drain electrode D, the fourth passivation layer 30 and the second passivation layer 24 in the second hole 262 are removed for forming a second contact hole TH2 partially exposing the common line CL and the connection electrode 22C on the common line CL, and a third contact hole TH3 is formed in the fourth passivation layer 30 for partially exposing the common electrode CE. For example, the first contact hole TH1, the second contact hole TH2, and the third contact hole TH3 may be formed by an etching process. A fourth patterned conductive layer 32 is then formed on the fourth passivation layer 30. The fourth patterned conductive layer 32 includes a pixel electrode PE and a bridge electrode 32T. The pixel electrode PE is electrically insulated from the common electrode CE by the fourth passivation layer 30. The pixel electrode PE contacts and is electrically connected to the drain electrode D via the first contact hole TH1, and a pixel voltage provided by the data line DL may be applied to the pixel electrode PE via the drain electrode D. The bridge electrode 32T contacts and is electrically connected to the connection electrode 22C via the second contact hole TH2 and the common electrode CE via the third contact hole TH3, and a common voltage provided by the common line CL may then be applied to the common electrode CE via the bridge electrode 32T. The pattern of the fourth patterned conductive layer 32 may be formed and defined by an exposure process using one photomask, a developing process, and an etching process. In this embodiment, the pixel electrode PE is disposed above the common electrode CE. The pixel electrode PE may include a plurality of branch electrodes 32B, a slit 32S exists between two adjacent branch electrodes 32B, and the common electrode CE may be substantially an electrode with a whole surface, but not limited thereto. In one alternative embodiment, the common electrode CE may be disposed above the pixel electrode PE, the common electrode CE may have branch electrodes and slits, and the pixel electrode PE may be an electrode with a whole surface, or the common electrode CE and the pixel electrode PE may both have branch electrodes and slits.

Figure 13:
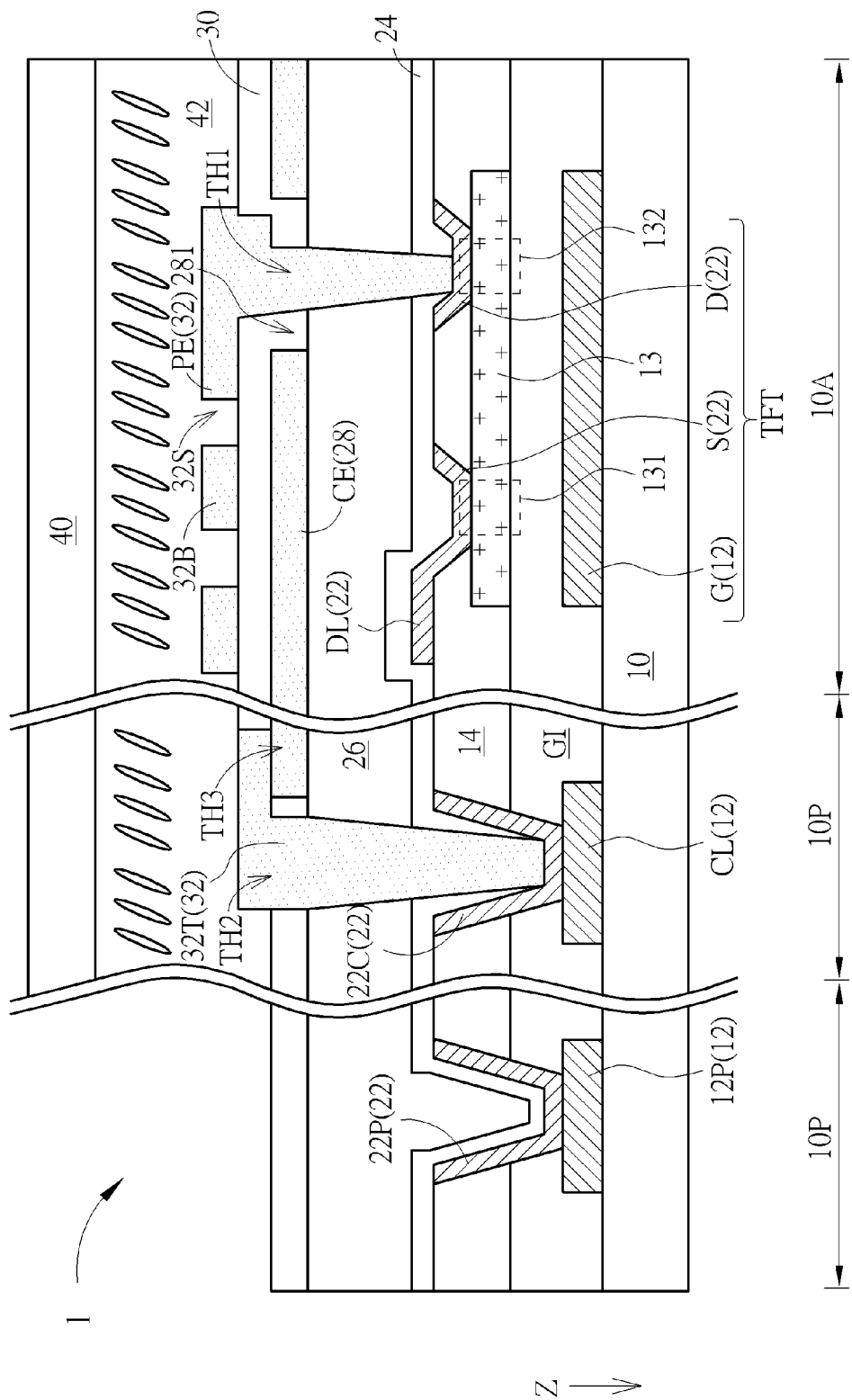

As shown in FIG. 13, a second substrate 40 is provided, and a display medium layer 42 is formed between the first substrate 10 and the second substrate 40 so as to form a display panel 1 of this embodiment. In this embodiment, the display medium layer 42 may be a liquid crystal layer, and the display panel 1 may be a liquid crystal display panel. The display panel 1 may further include other units such as a storage capacitor unit, an alignment film, a polarizer film, color filters, driving chips and spacers, and the units mentioned above are well-known in the related technical field of the present invention and will not be redundantly described. In addition, because the pixel electrode PE and the common electrode CE are both disposed on the first substrate 10, the display panel 1 is a horizontal electrical field liquid crystal display panel such as an in-plane switching (IPS) liquid crystal display panel or a fringe field switching (FFS) liquid crystal display panel, but not limited thereto. In one alternative embodiment, the pixel electrode PE and the common electrode CE may be disposed on the first substrate 10 and the second substrate 40 respectively so as to form a vertical electrical field liquid crystal display panel. The method of the present invention may also be applied to manufacturing methods of other kinds of non-self-luminous display panels such as electrophoresis display panels and electrowetting display panels or manufacturing methods of other kinds of self-luminous display panels such organic electroluminescent display panels, plasma display panels, and field emission display panels.

Figure 14:
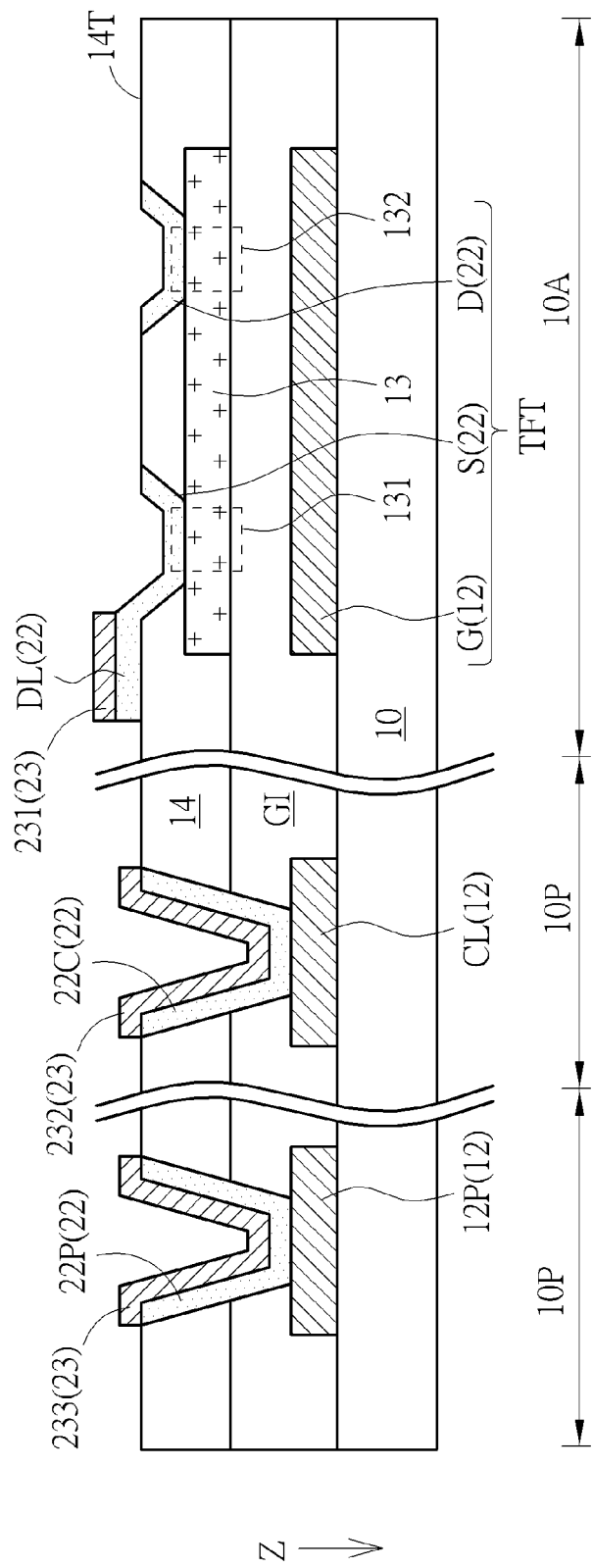
FIG. 14 and FIG. 15 are schematic diagrams illustrating a method for fabricating a display panel according to a second embodiment of the present invention.
Figure 15:
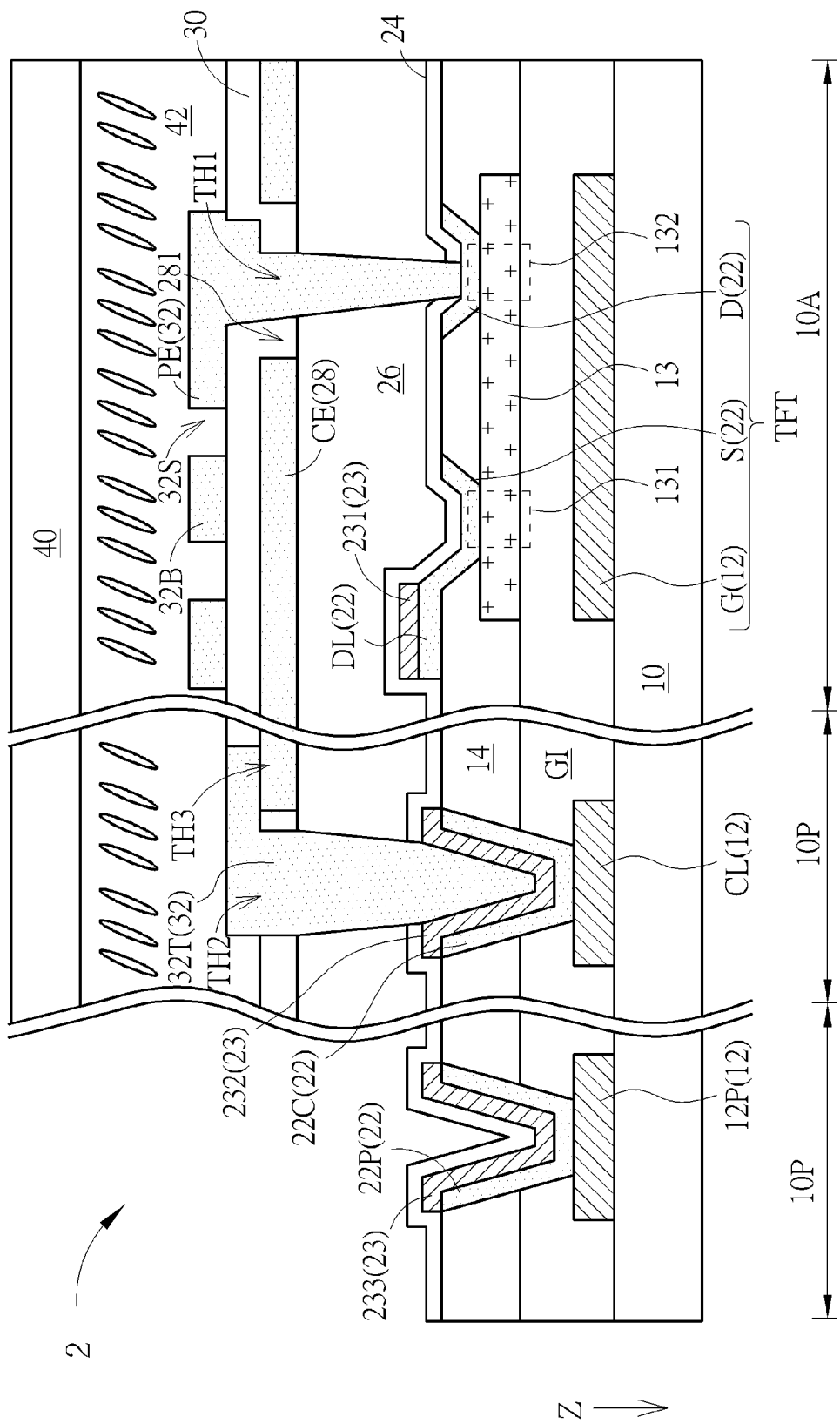

Please refer to FIG. 14 and FIG. 15. FIG. 14 and FIG. 15 are schematic diagrams illustrating a method for fabricating a display panel according to a second embodiment of the present invention. The method disclosed in FIG. 14 is performed after the steps of FIG. 7. As shown in FIG. 14, the difference between the first embodiment and this embodiment is that the method for fabricating the display panel in this embodiment further includes forming a patterned auxiliary conductive layer 23 on the second patterned conductive layer 22 after forming the second patterned conductive layer 22 and before forming the second passivation layer 24. A pattern of the second patterned conductive layer 22 is different from a pattern of the patterned auxiliary conductive layer 23. In other words, the pattern of the second patterned conductive layer 22 is defined by the lift-off process, and the pattern of the patterned auxiliary conductive layer 23 may be defined by an exposure process using another photomask, a developing process, and an etching process. In addition, the second patterned conductive layer 22 and the patterned auxiliary conductive layer 23 may be made of different materials, and a sheet resistance of the patterned auxiliary conductive layer 23 is lower than a sheet resistance of the second patterned conductive layer 22 preferably. For example, in this embodiment, a material of the second patterned conductive layer 22 may include transparent conductive materials such as indium tin oxide, indium zinc oxide, or other appropriate transparent conductive materials. A material of the patterned auxiliary conductive layer 23 may be an opaque conductive material such as a metal material. The patterned auxiliary conductive layer may include an auxiliary conductive line 231, an auxiliary common line 232, and an auxiliary connection pad 233. The auxiliary line 231 may be disposed on the data line DL, and the auxiliary line 231 may contact and be electrically connected to the data line DL. The auxiliary common line 232 may be disposed on the connection electrode 22C, and the auxiliary common line 232 may contact and be electrically connected to the connection electrode 22C. The auxiliary connection pad 233 may be disposed on the upper connection pad 22P, and the auxiliary connection pad 233 may be contact and electrically connected to the upper connection pad 22P. The auxiliary conductive line 231, the auxiliary common line 232, and the auxiliary connection pad 233 may be used to lower the electrical resistance of the data line DL, the common line CL, and the upper connection pad 22P because the sheet resistance of the patterned auxiliary conductive layer 23 is lower than the sheet resistance of the second patterned conductive layer 22.

As shown in FIG. 15, other layers such as passivation layers and conductive layers may then be formed on the patterned auxiliary conductive layer 23, the detail steps of forming these layers have been described in FIGS. 8-13 and the related contents, and a display panel 2 in this embodiment may be formed accordingly.

Figure 16:
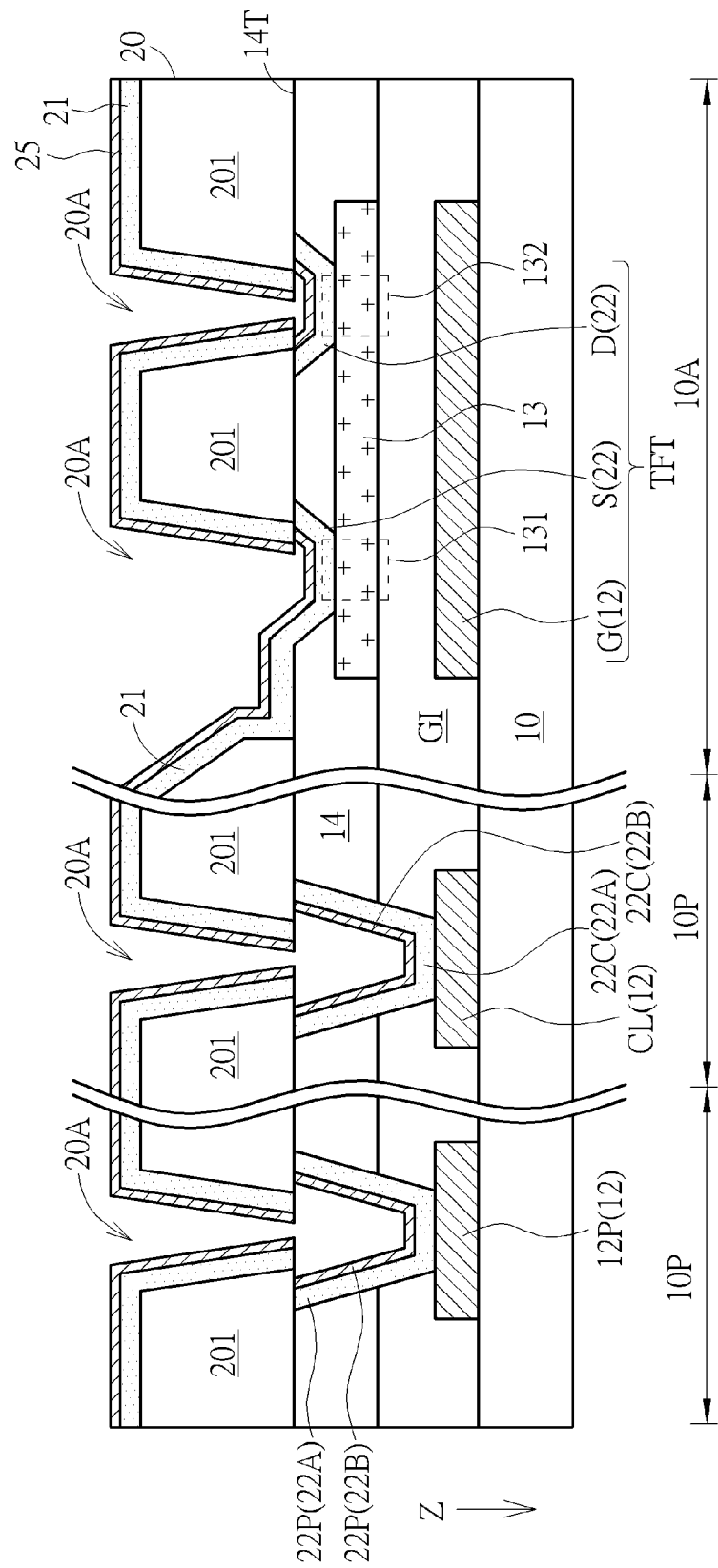
FIGS. 16-18 are schematic diagrams illustrating a method for fabricating a display panel according to a third embodiment of the present invention.
Figure 17:
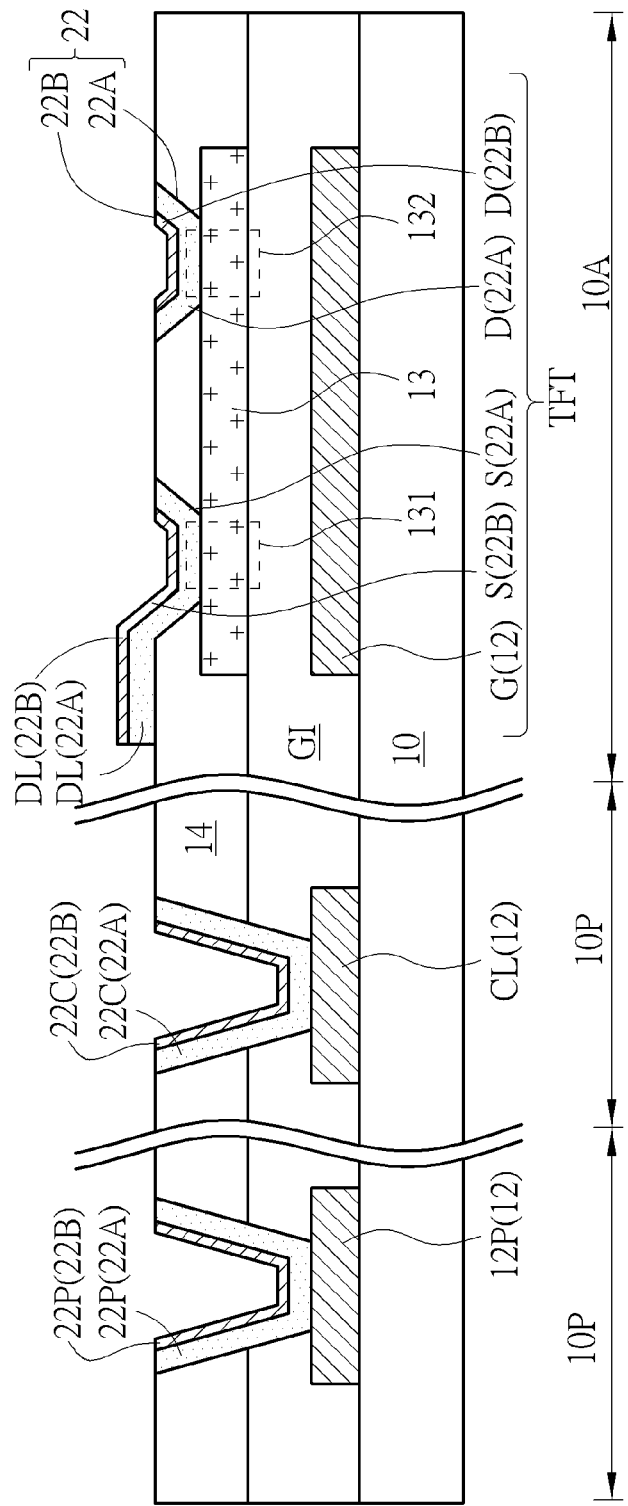
Figure 18:
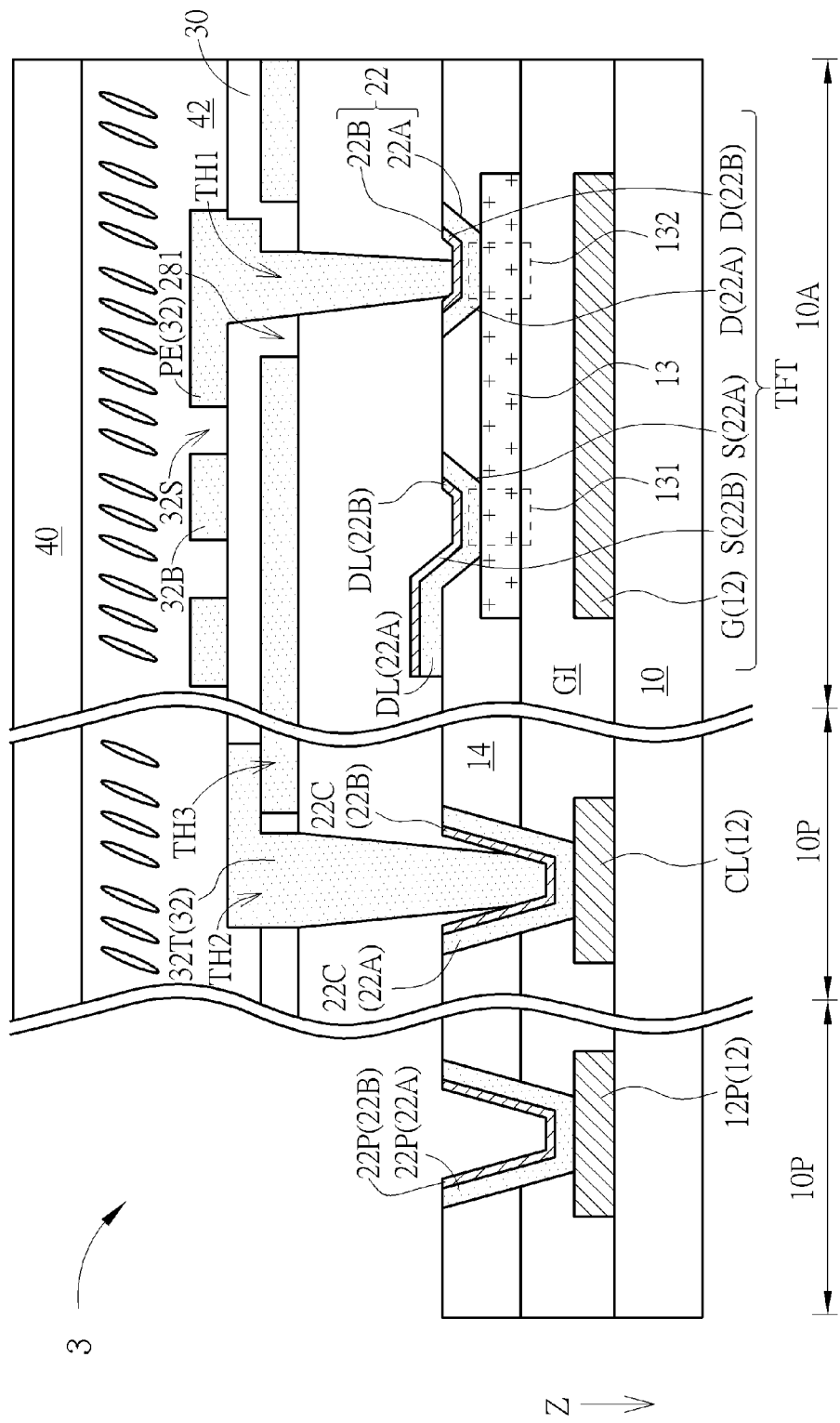

Please refer to FIGS. 16-18. FIGS. 16-18 are schematic diagrams illustrating a method for fabricating a display panel according to a third embodiment of the present invention. The method disclosed in FIG. 16 is performed after the steps of FIG. 6. As shown in FIG. 16, the difference between the first embodiment and this embodiment is that the method for fabricating the display panel in this embodiment further includes forming another conductive layer 25 on the conductive layer 21 after forming the conductive layer 21 on the patterned photoresist layer 20. In this embodiment, the conductive layer 21 and the conductive layer 25 may be a transparent conductive layer and an opaque conductive layer respectively. For example, the conductive layer 21 may be a transparent conductive layer, the conductive layer 25 may be an opaque conductive layer, and the materials of the transparent conductive layer and the opaque conductive layer are similar to the materials used on the embodiments mentioned above, but the present invention is not limited to this.

As shown in FIG. 17, a lift-off process is then performed to remove the patterned photoresist layer 20 and remove the conductive layer 21 and conductive layer 25 on the patterned photoresist layer 20 together, and other parts of the conductive layer 21 and conductive layer 25 will remain on the first connection section 131, the second connection section 132, a part of the upper surface 14T of the first passivation layer 14, the common line CL, and the lower connection pad 12P exposed by the patterned photoresist layer 20 so as to form the second patterned conductive layer 22. In other words, the second patterned conductive layer 22 in this embodiment includes a composite-layered patterned conductive layer composed of a patterned transparent conductive layer 22A and a patterned opaque conductive layer 22B stacked with each other. The patterned opaque conductive layer 22B is stacked on the patterned transparent conductive layer 22A. The patterned opaque conductive layer 22B contacts and is electrically connected to the patterned transparent conductive layer 22A. The patterns of the patterned opaque conductive layer 22B and the patterned transparent conductive layer 22A are simultaneously defined by the lift-off process. In this embodiment, a material of the patterned transparent conductive layer 22A may include indium tin oxide, indium zinc oxide, or other appropriate transparent conductive materials, and a material of the patterned opaque conductive layer 22B may include a metal material or an alloy, but not limited thereto. In an alternative embodiment, the conductive layer 21 may be an opaque conductive layer, the conductive layer 25 may be a transparent conductive layer, the patterned transparent conductive layer 22A is stacked on the patterned opaque conductive layer 22B, and the patterned transparent conductive layer 22A contacts and is electrically connected to the patterned opaque conductive layer 22B accordingly.

As shown in FIG. 18, other layers such as passivation layers and conductive layers may then be formed on the second patterned conductive layer 22, the detail steps of forming these layers have been described in FIGS. 8-13 and the related contents, and a display panel 3 in this embodiment may be formed accordingly.

To summarize the above descriptions, in the method for fabricating the display panel, the lift-off process is used to define the patterns of the gate insulation layer, the first passivation layer, and the second patterned conductive layer simultaneously so as to eliminate at least two sets of photomask. The manufacturing processes may be simplified and the manufacturing cost may be greatly reduced. In addition, the advantage such as self-alignment and short channel may be realized because the first passivation layer and the second patterned conductive layer including the source electrode and the drain electrode are defined by the same photomask, the aperture ratio may be enhanced accordingly, and the unit characteristics of the thin film transistor units may be unified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a display panel, comprising:
forming a first patterned conductive layer on a first substrate, wherein the first patterned conductive layer comprises a first gate electrode;
forming a gate insulation layer on the first substrate and the first patterned conductive layer;
forming a semiconductor channel layer on the gate insulation layer, wherein the semiconductor channel layer overlaps the first gate electrode in a vertical projective direction;
forming a first passivation layer on the gate insulation layer and the semiconductor channel layer;
forming a patterned photoresist layer on the first passivation layer, wherein the patterned photoresist layer comprises a first photoresist pattern, a second photoresist pattern, and a plurality of openings, and a thickness of the first photoresist pattern is higher than a thickness of the second photoresist pattern;
removing the first passivation layer exposed by the openings to expose a first contact section and a second contact section of the semiconductor channel layer;
performing an ashing process to remove the second photoresist pattern and partially exposing an upper surface of the first passivation layer;
forming a conductive layer on the patterned photoresist layer, wherein the conductive layer contacts the first contact section and the second contact section, and the conductive layer contacts the upper surface of the first passivation layer exposed by the patterned photoresist layer;
performing a lift-off process to remove the patterned photoresist layer and the conductive layer on the patterned photoresist layer to form a second patterned conductive layer including a source electrode contacting the first contact section, a drain electrode contacting the second contact section, and a data line disposed on the upper surface of the first passivation layer and connected to the source electrode;
forming a second passivation layer on the second patterned conductive layer; and
forming a pixel electrode on the second passivation layer, wherein the pixel electrode is electrically connected to the drain electrode.

2. The method for fabricating the display panel of claim 1, wherein the patterned photoresist layer on the first passivation layer is formed by:
forming a photoresist layer on the first passivation layer;
disposing a gray tone photomask above the photoresist layer, wherein the gray tone photomask has a light transmitting region, a half-tone region, and a light shielding region; and
forming the patterned photoresist layer by performing an exposure process using the gray tone photomask as a shielding mask and a developing process, wherein the light transmitting region is located corresponding to the openings, the light shielding region is located corresponding to the first photoresist pattern, and the half-tone region is located corresponding to the second photoresist pattern.

3. The method for fabricating the display panel of claim 1, wherein the first patterned conductive layer further comprises a common line, the method further comprises removing the first passivation layer and the gate insulation layer exposed by the openings of the patterned photoresist layer to partially expose the common line, and the second patterned conductive layer further comprises a connection electrode contacting the common line exposed by the patterned photoresist layer.

4. The method for fabricating the display panel of claim 3, further comprising:
forming a third passivation layer on the second passivation layer, wherein the third passivation layer comprises a first hole partially exposing the second passivation layer corresponding to the drain electrode and a second hole partially exposing the second passivation layer corresponding to the common line;
forming a third patterned conductive layer on the third passivation layer, wherein the third patterned conductive layer comprises a common electrode;
forming a fourth passivation layer on the third passivation layer, the third patterned conductive layer, and the second passivation layer exposed by the first hole and the second hole;
removing the fourth passivation layer and the second passivation layer in the first hole for forming a first contact hole partially exposing the drain electrode, removing a portion of the fourth passivation layer and a portion of the second passivation layer in the second hole to form a second contact hole partially exposing the common line, and a third contact hole in the fourth passivation layer partially exposing the common electrode; and
forming a fourth patterned conductive layer on the fourth passivation layer, wherein the fourth patterned conductive layer comprises the pixel electrode and a bridge electrode, the pixel electrode contacts the drain electrode via the first contact hole, the bridge electrode contacts the connection electrode via the second contact hole, and the bridge electrode contacts the common electrode via the third contact hole.

5. The method for fabricating the display panel of claim 1, wherein a material of the second patterned conductive layer comprises a metal material.

6. The method for fabricating the display panel of claim 1, wherein a material of the second patterned conductive layer comprises indium tin oxide (ITO) or indium zinc oxide (IZO), and the method further comprises forming a patterned auxiliary conductive layer on the second patterned conductive layer before forming the second passivation layer, wherein a pattern of the second patterned conductive layer is different from a pattern of the patterned auxiliary conductive layer, and a sheet resistance of the patterned auxiliary conductive layer is lower than a sheet resistance of the second patterned conductive layer.

7. The method for fabricating the display panel of claim 1, wherein the second patterned conductive layer comprises a patterned transparent conductive layer and a patterned opaque conductive layer stacked with each other.

8. The method for fabricating the display panel of claim 1, wherein the semiconductor channel layer comprises an oxide semiconductor channel layer.

9. The method for fabricating the display panel of claim 1, further comprising:

providing a second substrate; and forming a display medium layer between the first substrate and the second substrate.

\* \* \* \* \*